(12) United States Patent
Ishihara

(10) Patent No.: US 10,432,205 B2
(45) Date of Patent: Oct. 1, 2019

(54) QUANTUM INTERFERENCE DEVICE, ATOMIC OSCILLATOR, AND ELECTRONIC APPARATUS

(71) Applicant: Seiko Epson Corporation, Tokyo (JP)

(72) Inventor: Naoki Ishihara, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/845,153

(22) Filed: Dec. 18, 2017

(65) Prior Publication Data

US 2018/0198456 A1 Jul. 12, 2018

(30) Foreign Application Priority Data

Dec. 20, 2016 (JP) .................... 2016-246485

(51) Int. Cl.
  *H03B 17/00* (2006.01)
  *H03L 7/26* (2006.01)

(52) U.S. Cl.
  CPC .............. *H03L 7/26* (2013.01); *H03B 17/00* (2013.01); *H03B 2200/0044* (2013.01)

(58) Field of Classification Search
  CPC .......... G04F 5/14; G04F 5/145; H03B 17/00; H03L 7/26
  USPC ....................................... 331/3, 69, 70, 94.1
  See application file for complete search history.

(56) References Cited

U.S. PATENT DOCUMENTS

| | | | | |
|---|---|---|---|---|
| 4,434,406 A | * | 2/1984 | Fowks | H03L 7/26 313/550 |
| 6,265,945 B1 | * | 7/2001 | Delaney | G04F 5/145 331/3 |
| 6,320,472 B1 | | 11/2001 | Vanier | |
| 6,570,459 B1 | * | 5/2003 | Nathanson | G04F 5/14 331/94.1 |
| 2011/0187467 A1 | | 8/2011 | Chindo | |
| 2015/0180488 A1 | * | 6/2015 | Tanaka | G04F 5/145 331/94.1 |
| 2015/0180491 A1 | * | 6/2015 | Tanaka | H03L 7/26 331/94.1 |
| 2016/0218727 A1 | | 7/2016 | Maki | |

FOREIGN PATENT DOCUMENTS

| | | |
|---|---|---|
| JP | 56-032832 A | 4/1981 |
| JP | 2001-007437 A | 1/2001 |
| JP | 2011-091476 A | 5/2011 |
| JP | 2011-160251 A | 8/2011 |
| JP | 2016-092146 A | 5/2016 |

* cited by examiner

*Primary Examiner* — Levi Gannon

(74) *Attorney, Agent, or Firm* — Harness, Dickey & Pierce, P.L.C.

(57) ABSTRACT

A quantum interference device includes: an atomic cell in which alkali metal is sealed; a light source that emits light that excites the alkali metal; a light source temperature adjuster that adjusts temperature of the light source; a light receiver that receives light transmitted through the atomic cell and outputs an output signal in accordance with a light reception intensity; a detector that outputs an output signal in accordance with a chronological change in an amount of the light transmitted through the atomic cell based on the output signal of the light receiver; and a light source temperature controller that controls driving of the light source temperature adjuster based on the output signal of the detector.

15 Claims, 6 Drawing Sheets

QUANTUM INTERFERENCE DEVICE, ATOMIC OSCILLATOR, AND ELECTRONIC APPARATUS

This application claims priority to Japanese Patent Application No. 2016-246485, filed Dec. 20, 2016, the entirety of which is expressly incorporated by reference herein.

BACKGROUND

1. Technical Field

The present invention relates to a quantum interference device, an atomic oscillator, and an electronic apparatus.

2. Related Art

As oscillators with high long-term frequency stability, there are known atomic oscillators that oscillate based on energy transition of alkali metal atoms such as rubidium or cesium (for example, see the specification of U.S. Pat. No. 6,320,472).

For example, an atomic oscillator disclosed in the specification of U.S. Pat. No. 6,320,472 includes a cell (atomic cell) that seals gaseous alkali metal, a semiconductor laser element that emits light to be radiated to the cell, and an light detector that detects light transmitted through the cell and controls driving of a semiconductor laser based on a detection result of the light detector.

In the atomic oscillator disclosed in the specification of U.S. Pat. No. 6,320,472, there is a problem that when the alkali metal is absorbed into an internal wall of the cell due to a chronological change, the density of the alkali metal in the cell deteriorates or the semiconductor laser elements deteriorate, and thus an output of the semiconductor laser element is reduced chronologically, a signal intensity detected by the light detector consequently deteriorate and frequency precision consequently deteriorates.

SUMMARY

An advantage of some aspects of the invention is that it provides a quantum interference device capable of improving long-term frequency stability and provides an atomic oscillator or the like including the quantum interference device.

At least a part of the advantage can be achieved by the following configurations.

A quantum interference device according to this application example includes: an atomic cell in which alkali metal is sealed; a light source that emits light that excites the alkali metal; a light source temperature adjuster that adjusts temperature of the light source; a light receiver that receives light transmitted through the atomic cell and outputs an output signal in accordance with a light reception intensity; a detector that outputs an output signal in accordance with a chronological change in an amount of the light transmitted through the atomic cell based on the output signal of the light receiver; and a light source temperature controller that controls driving of the light source temperature adjuster based on the output signal of the detector.

In the quantum interference device, the driving of the light source temperature adjuster is controlled based on a signal in accordance with a chronological change in the amount of light transmitted through the atomic cell. Therefore, even when at least one of the density of the alkali metal in the atomic cell and the amount of light of the light source is reduced chronologically, it is possible to decrease a chronological reduction in the output signal of the light receiver. Therefore, frequency characteristics of high precision can be exerted using the output signal of the light receiver for a long time. Accordingly, it is possible to improve long-term frequency stability of the quantum interference device.

In the quantum interference device according to the application example, it is preferable that the detector includes an automatic gain control circuit to which the output signal of the light receiver is input and outputs an output signal in accordance with an amplification factor of the automatic gain control circuit.

With this configuration, it is possible to realize the detector with a relatively simple configuration.

It is preferable that the quantum interference device according to the application example further includes: a cell temperature adjuster that adjusts temperature of the atomic cell; and a cell temperature controller that controls driving of the cell temperature adjuster based on the output signal of the detector.

With this configuration, even when the density of the alkali metal in the atomic cell chronologically is reduced, it is possible to accurately decrease a chronological reduction in the output signal of the light receiver.

It is preferable that the quantum interference device according to the application example further includes: a signal generator that generates a microwave signal in accordance with a transition frequency between two ground levels of atoms of the alkali metal based on an output signal of the light receiver; and a driving circuit that drives the light source by inputting a driving current in which a modulation current based on the microwave signal is superimposed on a bias current to the light source.

With this configuration, the electromagnetically induced transparency phenomenon can be caused by interaction of the light from the light source and the alkali metal atoms. Then, it is possible to realize the quantum interference device (atomic oscillator) of a CPT scheme.

It is preferable that the quantum interference device according to the application example further includes an automatic gain control circuit that amplifies and outputs the microwave signal so that an amplitude of the microwave signal is constant.

With this configuration, it is possible to decrease a chronological reduction in a signal component for generating the microwave signal in the output signal of the light receiver or a change in the signal component due to disturbance (a temperature change or the like).

It is preferable that the quantum interference device according to the application example further includes a bias current adjuster that adjusts a value of the bias current based on the output signal of the light receiver.

With this configuration, control can be performed such that the central wavelength of the light from the light source becomes an absorption wavelength of the alkali metal. With a change (reduction) in the temperature of the light source, it is possible to adjust (increases) the bias current. Therefore, with control of driving of the light source temperature adjuster by the light source temperature controller, it is possible to control the amount of light of the light source such that the amount of the light is maintained to be constant.

In the quantum interference device according to the application example, it is preferable that the signal generator generates the microwave signal based on a result obtained by detecting the output signal of the light receiver at each first period, and the detector outputs a signal in accordance with the chronological change at a second period different from the first period.

With this configuration, it is possible to generate the signal with high precision in regard to the signal generator and the detector.

An atomic oscillator according to this application example includes the quantum interference device according to the application example described above.

In the atomic oscillator, it is possible to obtain the excellent advantages of the quantum interference device and it is possible to have excellent oscillation characteristics.

An electronic apparatus according to this application example includes the quantum interference device according to the application example described above.

In the electronic apparatus, it is possible to obtain the excellent advantages of the quantum interference device and it is possible to have excellent oscillation characteristics.

A vehicle according to this application example includes the quantum interference device according to the application example described above.

In the vehicle, it is possible to obtain the excellent advantages of the quantum interference device and it is possible to have excellent oscillation characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a quantum interference device, an atomic oscillator, an electronic apparatus, and a vehicle will be described in detail according to preferred embodiments illustrating the appended drawings.

1. Atomic Oscillator (Quantum Interference Device)

First, an atomic oscillator (an atomic oscillator including a quantum interference device) will be described. Hereinafter, an example of the atomic oscillator which is a kind (example) of quantum interference device will be described. However, the quantum interference device is not limited to the atomic oscillator. For example, a quantum interference device can also be applied to a device such as a magnetic sensor or a quantum memory.

First Embodiment

Figure 1:
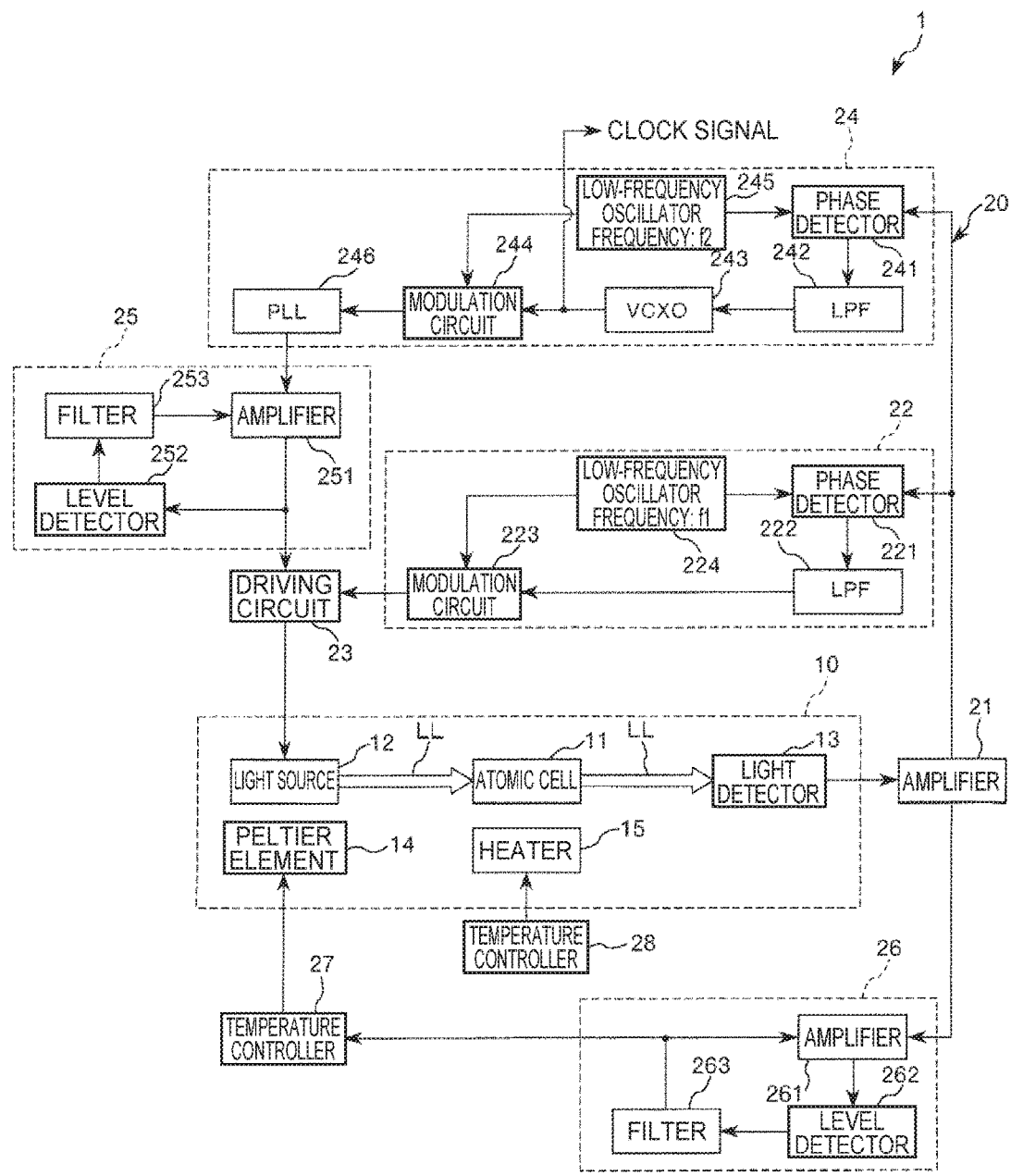
FIG. 1 is a schematic diagram illustrating an overall configuration of an atomic oscillator (which is a kind of a quantum interference device) according to a first embodiment.

FIG. 1 is a schematic diagram illustrating an overall configuration of an atomic oscillator (which is a kind of a quantum interference device) according to a first embodiment.

The atomic oscillator 1 illustrated in FIG. 1 is an atomic oscillator that uses a coherent population trapping (CPT) phenomenon that occurs in which when two pieces of resonance light with specific different wavelengths are simultaneously radiated to alkali metal atoms, the two pieces of resonance light are transmitted without being absorbed by the alkali metal atoms. The coherent population trapping phenomenon is also said to be an electromagnetically induced transparency (EIT) phenomenon. As illustrated in FIG. 1, the atomic oscillator 1 includes a package unit 10 and a circuit unit 20 electrically connected to the package unit 10.

The package unit 10 includes a light source 12 that emits light, an atomic cell 11 (gas cell) in which, for example, alkali metal atoms such as rubidium or cesium are sealed, a light detector 13 (light receiver), a peltier element 14 (light source temperature adjuster), and a heater 15 (cell temperature adjuster), which are accommodated in a package (not illustrated) functioning as a thermostatic chamber. A package included in the package unit 10 may be divided into two packages, a package (thermostatic chamber) that accommodates the light source 12 and the peltier element 14 and a package (thermostatic chamber) that accommodates the atomic cell 11, the light detector 13, and the heater 15.

Here, the light source 12 is driven by a driving current in which a modulation current is superimposed on a bias current. Then, the light source 12 emits light LL that includes light with a central wavelength in accordance with a current value of the bias current and two pieces of sideband light (first light and second light) with wavelengths shifted by a wavelength in accordance with a frequency of the modulation current on both sides of the wavelength of the light. The light LL passes through the atomic cell 11 and is detected by the light detector 13. The peltier element 14 adjusts the temperature of the light source 12 by heating or cooling the light source 12. The heater 15 adjusts the temperature of the atomic cell 11 by heating the atomic cell 11.

The circuit unit 20 includes an amplifier 21, a bias current adjuster 22, a driving circuit 23, a signal generator 24, an automatic gain control circuit 25 (AGC: automatic gain control amplifier), a detector 26, a temperature controller 27 (light source temperature controller), and a temperature controller 28 (cell temperature controller), which are installed outside of the package of the package unit 10. At least a part of the circuit unit 20 may be accommodated in the package of the package unit 10.

Here, the driving circuit 23 supplies the light source 12 with a driving current in which a modulation current is superimposed on a bias current. The bias current adjuster 22 adjusts a current value of a bias current of the driving circuit 23 based on a detection result of the light detector 13. The signal generator 24 generates a microwave signal in accordance with a transition frequency between two ground levels of the alkali metal atoms in the atomic cell 11 based on the detection result of the light detector 13. The signal generator 24 includes a voltage controlled crystal oscillator 243 (VCXO), adjusts frequency of the microwave signal used as the modulation current so that the EIT phenomenon occurs by the alkali metal atoms in the atomic cell 11 and the above-described two pieces of sideband light, stabilizes an output signal of the voltage controlled crystal oscillator 243 (VCXO) at a predetermined frequency, and outputs the output signal as a clock signal of the atomic oscillator 1. The automatic gain control circuit 25 adjusts the amplitude of the modulation current (the microwave signal) from the signal generator 24 and inputs the adjusted amplitude of the modulation current to the driving circuit 23.

The temperature controller 27 (the light source temperature controller) controls driving of the peltier element 14. The temperature controller 28 controls driving of the heater 15 (the cell temperature adjuster). In particular, the temperature controller 27 (the light source temperature controller) controls the driving of the peltier element 14 based on an output signal of the detector 26. The detector 26 outputs a signal in accordance with a chronological change in light absorption characteristics of the alkali metal in the atomic cell 11 based on an output signal of the light detector 13.

Hereinafter, the units of the atomic oscillator 1 will be described in sequence.

Package Unit

As described above, the package unit 10 illustrated in FIG. 1 includes the light source 12, the atomic cell 11 (gas cell), the light detector 13 (light receiver), the peltier element 14 (light source temperature adjuster), and the heater 15 (cell temperature adjuster).

Light Source

The light source 12 is supplied with the driving current in which the modulation current is superimposed on the bias current and has a function of emitting the above-described two pieces of sideband light as the first light and the second light with different frequencies (wavelengths). The light source 12 is not particularly limited as long as a light source has the above-described functions. For example, a semiconductor laser such as a vertical cavity surface emitting laser (VCSEL) can be exemplified.

Atomic Cell

Alkali metal (alkali metal atoms) such as gaseous rubidium, cesium, or sodium is sealed in the atomic cell 11. In the atomic cell 11, a rare gas such as argon or neon an inert gas such as nitrogen may be sealed as a buffer gas along with the gaseous alkali metal as necessary. In the atomic cell 11, the gaseous alkali metal and a liquid or solid alkali metal are maintained in an equilibrium state. The gaseous alkali metal is supplied to the electromagnetically induced transparency phenomenon in the following manner.

The alkali metal atom has three energy levels of a level system, two different ground levels (first and second ground levels) and an excitation level. The first ground level is an energy level lower than the second ground level. Here, when resonance light (first resonance light) with a frequency $\omega 1$ equivalent to an energy difference between the first ground level and the excitation level and resonance light (second resonance light) with a frequency $\omega 2$ equivalent to an energy difference between the second ground level and the excitation level are separately radiated to the alkali metal atoms, light absorption occurs. On the other hand, when the first resonance light and the second resonance light (a pair of pieces of resonance light) are simultaneously radiated, the electromagnetically induced transparency (EIT) phenomenon in which both the first resonance light and the second resonance light are transmitted without being absorbed into the alkali metal atoms occurs.

The EIT phenomenon occurs when the first resonance light and the second resonance light are simultaneously radiated to the alkali metal atoms and a frequency difference $(\omega 1-\omega 2)$ between the frequency $\omega 1$ of the first resonance light and the frequency $\omega 2$ of the second resonance light matches a frequency $\omega 0$ equivalent to an energy difference $\Delta E$ between the first and second ground levels. Accordingly, when light absorptivity (light transmittance) of the alkali metal atoms of the first resonance light and the second resonance light is changed in accordance with the frequency difference $(\omega 1-\omega 2)$ is identical to the frequency $\omega 0$, the EIT phenomenon occurs and the intensities of the first resonance light and the second resonance light transmitted through the alkali metal atoms sharply increase. A sharp signal occurring with the EIT phenomenon is called an EIT signal. The EIT signal has an eigenvalue determined in accordance with a kind of alkali metal atom. Therefore, an oscillator with high precision can be configured using the EIT signal as a reference.

For example, when the alkali metal atom is the cesium atom, the frequency $\omega 0$ equivalent to the energy difference $\Delta E$ is 9.1926 GHz. Therefore, when two kinds of light in which the frequency difference $(\omega 1-\omega 2)$ is 9.1926 GHz is simultaneously radiated to the cesium atoms, the EIT signal is detected.

For example, a magnetic field generator (not illustrated) that has a coil or the like applying a magnetic field to the alkali metal through conduction is installed near the atomic cell 11. A resolution can be improved by enlarging a gap between a plurality of different degenerated energy levels of the alkali metal atoms through the magnetic field from the magnetic field generator by Zeeman splitting. As a result, it is possible to improve precision of an oscillation frequency of the atomic oscillator 1.

Optical components such as a wavelength plate, a neutral density filter, a lens, and a polarization plate are disposed between the light source 12 and the atomic cell 11 described above.

Light Receiver

The light detector 13 has a function of receiving light (the first light and the second light) transmitted through the atomic cell 11, detecting the light, and outputting a detection signal in accordance with the intensity of the detected light. The light detector 13 is not particularly limited as long as the intensity of the above-described light can be detected. For example, a light detector (light-receiving element) such as a photodiode can be exemplified.

Peltier Device

Although not illustrated, the peltier element 14 is thermally connected to the light source 12 and has a function of adjusting the temperature of the light source 12. In particular, the peltier element 14 has a function of heating or cooling the light source 12 depending on a direction of a current to be supplied. Thus, even when a range of an environmental temperature is broad, the light source 12 can be adjusted to a target temperature. A heater may be used instead of the peltier element 14. In this case, the atomic cell 11 is heated by the heater or the heater 15 may be omitted.

Heater

Although not illustrated, for example, the heater 15 is disposed above the above-described atomic cell 11 or is connected to the atomic cell 11 via a thermally conductive member such as metal. The heater 15 is configured to include a heat resistor and has a function of heating the atomic cell 11 (more specifically, the alkali metal in the atomic cell 11). Thus, the alkali metal in the atomic cell 11 can be maintained to be gaseous.

Circuit Unit

As described above, the circuit unit 20 includes the amplifier 21, the bias current adjuster 22, the driving circuit 23, the signal generator 24, the automatic gain control circuit 25 (AGC: automatic gain control amplifier), the detector 26, the temperature controller 27 (light source temperature controller), and the temperature controller 28 (cell temperature controller).

Amplifier

The amplifier 21 amplifies an output signal of the light detector 13, converts the output signal into a voltage signal, and outputs the voltage signal. The output signal of the amplifier 21 is input to the bias current adjuster 22, the signal generator 24, and the detector 26.

Bias Current Adjuster

The bias current adjuster 22 includes a phase detector 221, a lowpass filter 222 (LPF), a modulation circuit 223, and a low-frequency oscillator 224. The phase detector 221 synchronously detects the output signal of the amplifier 21 at a period (for each fourth period) using an output signal of the low-frequency oscillator 224 oscillated at a low frequency f1 of about a few of Hz to hundreds of Hz. An output signal of the phase detector 221 is input to the lowpass filter 222. The lowpass filter 222 is an integration circuit and outputs a voltage signal from which an alternating-current component of the output signal of the phase detector 221 is removed. The modulation circuit 223 modulates an output signal of the lowpass filter 222 using the output signal (oscillation signal) of the low-frequency oscillator 224 as a modulation signal so that the output signal can be detected by the phase detector 221.

Driving Circuit

The driving circuit 23 minutely adjust the bias current in accordance with an output signal of the modulation circuit 223 and sets a bias current to be supplied to the light source 12 (sets a central wavelength of the light emitted from the light source 12). In this way, the central wavelength of the light emitted by the light source 12 is controlled (minutely adjusted) to be stabilized through a feedback loop passing the light source 12, the atomic cell 11, the light detector 13, the phase detector 221, the lowpass filter 222, the modulation circuit 223, and the driving circuit 23. Here, the bias current adjuster 22 adjusts a current value of the bias current set in the driving circuit 23 for each period (fourth period) corresponding to the oscillation frequency of the low-frequency oscillator 224. The adjusted period (fourth period) is longer than a detection period (first period) in the signal generator 24 to be described below. The feedback loop may be performed through analog processing or digital processing.

The driving circuit 23 superimposes the modulation current from the automatic gain control circuit 25 to be described below on the bias current minutely adjusted as described above and supplies the superimposed modulation current to the light source 12. When the frequency modulation is applied to the light to be emitted from the light source 12 by the modulation current, a plurality of pairs of light with frequencies shifted by frequency of the modulation current on both sides are generated as sideband light along with the light with the central frequency in accordance with the bias current.

Signal Generator

The signal generator 24 includes a phase detector 241, a lowpass filter 242 (LPF), a voltage controlled crystal oscillator 243 (VCXO), a modulation circuit 244, a low-frequency oscillator 245, and a phase synchronization circuit 246 (PLL: phase locked loop). The phase detector 241 synchronously detects the output signal of the amplifier 21 at a period (for each first period) using an output signal of the low-frequency oscillator 245 oscillated at a low frequency f2 of about a few of Hz to hundreds of Hz. An output signal of the phase detector 241 is input to the lowpass filter 242. The lowpass filter 242 is an integration circuit and outputs a voltage signal from which an alternating-current component of the output signal of the phase detector 241 is removed. Then, in the voltage controlled crystal oscillator 243 (VCXO), an oscillation frequency of the voltage controlled crystal oscillator 243 (VCXO) is minutely adjusted in accordance with the magnitude of the output signal of the lowpass filter 242. The voltage controlled crystal oscillator 243 (VCXO) is oscillated at a low frequency of, for example, about a few of Hz to hundreds of Hz.

The modulation circuit 244 modulates an output signal of the voltage controlled crystal oscillator 243 (VCXO) using the oscillation signal of the low-frequency oscillator 245 as a modulation signal so that the output signal can be detected by the phase detector 241.

The phase synchronization circuit 246 converts the output signal of the modulation circuit 244 at a constant frequency conversion ratio (multiplication ratio) and outputs the converted signal. Thus, the phase synchronization circuit 246 multiplies the output of the modulation circuit 244 to generate the modulation current as a microwave signal. For example, the phase synchronization circuit 246 converts the output signal into a signal with the same frequency as ½ (in the case of the cesium atom, 9.1926 GHz/2=4.5963 GHz) of the frequency difference equivalent to the energy difference between two ground levels of the alkali metal atom with a magnetic quantum number m=0 sealed in the atomic cell 11. The phase synchronization circuit 246 converts the output signal of the modulation circuit 244 into a signal with the same frequency as of the frequency difference (in the case of the cesium atom, 9.1926 GHz) equivalent to the energy difference between two ground levels of the alkali metal atom with the magnetic quantum number m=0 sealed in the atomic cell 11.

Automatic Gain Control Circuit

The automatic gain control circuit 25 is an amplification circuit (amplifier) that automatically adjusts an amplification factor (gain) so that the amplitude of the signal (modulation current) from the phase synchronization circuit 246 is constant. That is, the automatic gain control circuit 25 has an amplification function of amplifying the modulation current from the phase synchronization circuit 246 and an automatic gain control function of adjusting the amplification factor of the amplification function so that the amplitude of the modulation current from the phase synchronization circuit 246 becomes a preset constant amplitude. Thus, even when an installation environment (for example, temperature, a magnetic field, or the like) of the atomic oscillator 1 is changed, the modulation current with the present constant amplitude can be obtained by removing a change in the amplitude of the modulation current caused due to the change in the installation environment. In particular, the automatic gain control circuit 25 adjusts the amplitude of the microwave signal from the phase synchronization circuit 246 for each period longer than the detection period in the signal generator 24.

The automatic gain control circuit 25 includes an amplifier 251, a level detector 252, and a filter 253. The amplifier 251 has a function of amplifying and outputting the modulation current from the phase synchronization circuit 246, and thus the amplification factor is adjusted in accordance with a signal from the filter 253. The modulation current output from the amplifier 251 is input to the driving circuit 23 and the level detector 252. The level detector 252 detects an output level of the modulation current from the amplifier 251 at a predetermined period (for example, 1 second to 10000 seconds) and outputs a signal in accordance with the detection result. The signal from the level detector 252 is input to the amplifier 251 via the filter 253 that has a bandwidth corresponding to a detection period of the level detector 252. As described above, the amplification factor of the amplifier 251 is adjusted in accordance with the signal from the level detector 252. The configuration of the automatic gain control circuit 25 is not limited to the illustrated configuration. For example, a buffer circuit may be installed between the level detector 252 and the filter 253.

An output signal of the automatic gain control circuit 25 is input as a current (modulation current) with a modulation frequency fm to the driving circuit 23 because of a reduction in the change in the amplitude of the output signal through the above-described automatic gain control function. In this way, one pair of pieces of sideband light emitted by the light source 12 is controlled (minutely adjusted) to become a pair of pieces of resonance lights generating the EIT phenomenon in the alkali metal atoms through a feedback loop passing the light source 12, the atomic cell 11, the light detector 13, the phase detector 241, the lowpass filter 242, the voltage controlled crystal oscillator 243, the modulation circuit 244, the phase synchronization circuit 246, the automatic gain control circuit 25, and the driving circuit 23.

As described above, the EIT signal which is a sharp signal generated with the EIT phenomenon is detected by the light detector 13 and the output signal of the voltage controlled crystal oscillator 243 is stabilized at a predetermined frequency using the EIT signal as a reference signal. Then, the output signal of the voltage controlled crystal oscillator 243 is output to the outside. At this time, the output signal of the voltage controlled crystal oscillator 243 may be frequency-converted to a target frequency at a predetermined frequency conversation ratio, for example, by a frequency conversion circuit (not illustrated) such as a direct digital synthesizer (DDS), as necessary.

Detector

The detector 26 has a function of outputting a signal in accordance with a chronological change in the amount of light LL transmitted through the atomic cell 11 based on an output signal of the light detector 13 (in the embodiment, an output signal amplified by the amplifier 21). The detector 26 has the same circuit configuration as the automatic gain control circuit. That is, as illustrated in FIG. 1, the detector 26 includes an amplifier 261, a level detector 262, and a filter 263. Here, unlike the above-described automatic gain circuit 25, the detector 26 does not use an output signal of the amplifier 261 as an output signal of the detector 26, but uses an output signal (a signal in accordance with an amplification factor of the amplifier 261) of the filter 263 as an output signal of the detector 26.

The amplifier 261 is an amplifier with a variable amplification factor and has a function of amplifying and outputting an output signal of the amplifier 21, and thus the amplification factor is adjusted in accordance with the signal from the filter 263. The signal output from the amplifier 261 is input to the level detector 262. The level detector 262 detects an output level of the signal from the amplifier 261 at a predetermined period (for example, 1 second to 10000 seconds) and outputs a signal in accordance with the detection result. The signal from the level detector 262 is input to the amplifier 261 via the filter 263 that has a bandwidth corresponding to a detection period of the level detector 262. As described above, the amplification factor of the amplifier 261 is adjusted in accordance with the signal from the level detector 262. Here, by appropriately setting the detection period of the above-described level detector 262 and the bandwidth of the filter 263, it is possible to remove an unnecessary frequency component from the output signal of the amplifier 261. As a result, it is possible to reduce an influence of a short-term amplitude change due to disturbance (a temperature change or the like) of the output signal of the amplifier 21 on the detection result of the detector 26. The configuration of the detector 26 is not limited to the illustrated configuration as long as the above-described function can be exerted. For example, a buffer circuit may be installed between the level detector 262 and the filter 263.

Light Source Temperature Controller

The temperature controller 27 has a function of controlling driving of the peltier element 14 so that the temperature of the light source 12 becomes a target temperature based on a detection result of a temperature sensor (not illustrated) detecting the temperature of the light source 12. Thus, it is possible to reduce a change in the output of the light source 12 due to the change in the temperature.

In particular, the temperature controller 27 is configured to adjust the target temperature based on the output signal of the detector 26 (that is, a signal in accordance with the amplification factor of the amplifier 261). That is, the temperature controller 27 is configured to control driving of the peltier element 14 (light source temperature adjuster) based on the output signal of the detector 26. For example, the temperature controller 27 lowers the target temperature by a predetermined temperature whenever the amplification factor of the amplifier 261 becomes a predetermined value or more. Thus, even when at least one of the density of the alkali metal in the atomic cell 11 and the amount of light of the light source 12 is reduced chronologically, it is possible to decrease a chronological reduction in the output signal of the light detector 13. Here, the specific target temperature is set appropriately in accordance with all conditions of the atomic cell 11 such as characteristics of the light source 12 and is not particularly limited. For example, the specific target temperature is considered to be a range equal to or greater than 30° C. and equal to or less than 40° C. or a predetermined temperature in this range.

Cell Temperature Controller

The temperature controller 28 has a function of controlling driving of the heater 15 so that the temperature of the heater 15 becomes a target temperature (about 60° C.) based on a detection result of the temperature sensor (not illustrated) detecting the temperature of the atomic cell 11. Thus, the alkali metal in the atomic cell 11 can be maintained to be gaseous at an appropriate density. The heater 15 is not particularly limited. For example, the heater 15 is configured to include a heat resistor generating heat because of conduction and is installed to come into contact with the atomic cell 11 or not to come into contact with the atomic cell 11 via another member.

In the atomic oscillator 1, as described above, the bias current adjuster 22 adjusts the current value of the bias current of the driving circuit 23 based on the detection result of the light detector 13 and the signal generator 24 adjusts the frequency of the modulation current of the driving circuit 23. The automatic gain control circuit 25 adjusts the current value (level) of the modulation current from the signal generator 24 and inputs the adjusted current value of the modulation current to the driving circuit 23. The signal generator 24 stabilizes the output signal of the voltage controlled crystal oscillator 243 (VCXO) at a predetermined frequency so that the EIT phenomenon by the above-described two pieces of sideband light and the alkali metal atoms in the atomic cell 11 occurs and outputs the output signal as a clock signal of the atomic oscillator 1.

Here, the temperature controller 27 controls driving of the peltier element 14 so that the temperature of the light source 12 becomes the target temperature. The temperature controller 28 controls driving of the heater 15 so that the temperature of the atomic cell 11 becomes the target temperature.

In particular, in the atomic oscillator 1, the detector 26 detects a reduction in the output to decrease the reduction in the output of the light detector 13 due to chronological deterioration in the atomic cell 11 and the light source 12, and the temperature controller 27 controls driving of the peltier element 14 based on the detection result of the detector 26 so that a portion equivalent to the reduction in the output is compensated. Thus, it is possible to improve long-term frequency stability of the atomic oscillator 1. This point will be described in detail below.

Improvement in Stability of Long-Term Frequency

In the atomic oscillator 1, the current value of the bias current is changed at the frequency f1 which is an oscillation frequency of the low-frequency oscillator 224 of the bias current adjuster 22. With the change in the current value of the bias current, the central frequency of the light LL is also changed at the frequency f1. The current value (amplitude) of the modulation current (the microwave signal) is changed at the frequency f2 which is an oscillation frequency of the low-frequency oscillator 245 of the signal generator 24. With the change in the modulation current, the frequencies of the two pieces of sideband light of the light LL are also changed at the frequency f2.

The light LL passes through the atomic cell 11 and is detected by the light detector 13. Here, in the output signal (current signal) of the light detector 13, light absorption characteristics by interaction of the light with the central frequency of the light LL and the alkali metal in the atomic cell 11 appears in synchronization with the frequency f1, and light absorption characteristics by interaction of the two pieces of sideband light of the light LL and the alkali metal in the atomic cell 11 appears in synchronization with the frequency f2. Therefore, as described above, the bias current adjuster 22 detects the output signal of the light detector 13 at the frequency f1 and adjusts the bias current using the detection result. The signal generator 24 detects the output signal of the light detector 13 at the frequency f2 and generates the microwave signal using the detection result.

Figure 2:
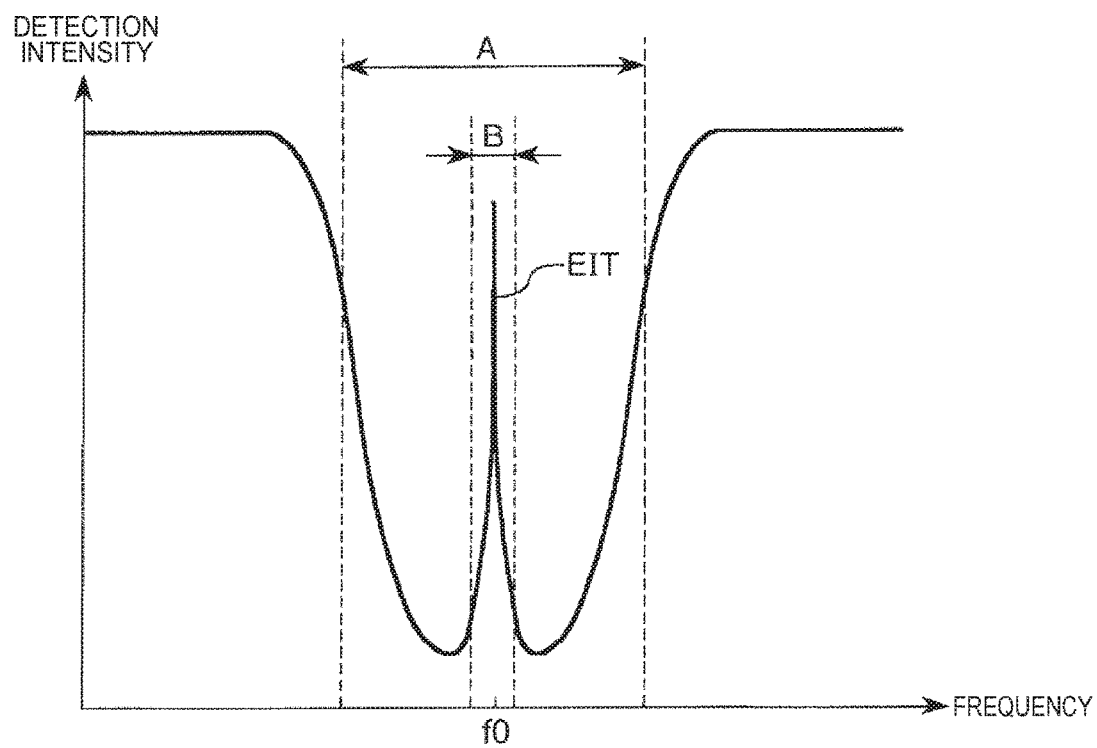
FIG. 2 is a diagram illustrating a relation between an EIT signal and a signal of each unit in the atomic oscillator illustrated in FIG. 1 (a graph illustrating a relation between an output intensity of a light receiver and a central frequency of light from a light source).
Figure 3:
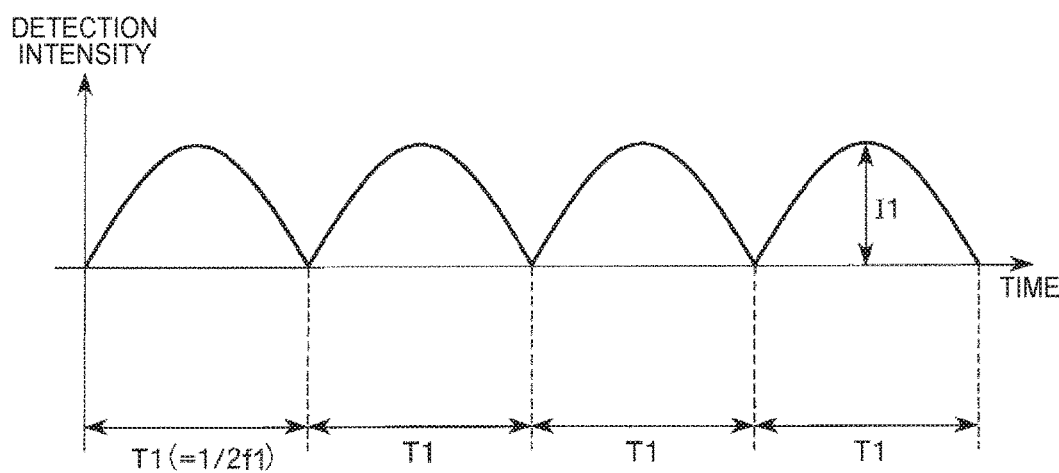
FIG. 3 is a graph illustrating an output signal of the light receiver when a frequency band of an output signal of a bias adjuster is in a range indicated by A in FIG. 2.
Figure 4:
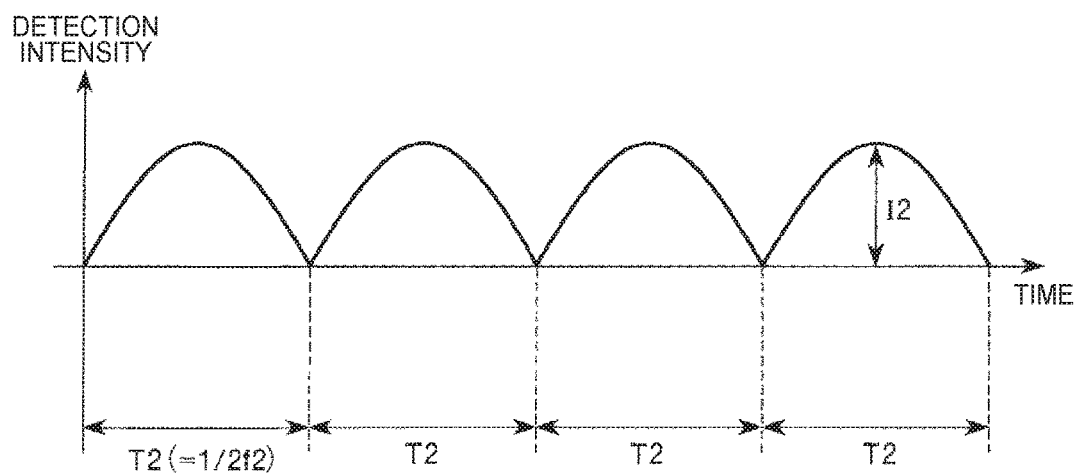
FIG. 4 is a graph illustrating an output signal of the light receiver when a frequency band of an output signal of a signal generator is in a range indicated by B in FIG. 2.

FIG. 2 is a diagram illustrating a relation between an EIT signal and a signal of each unit in the atomic oscillator illustrated in FIG. 1, that is, a graph illustrating a relation between an output intensity of a light receiver (output intensity) and a central frequency of light from a light source. FIG. 3 is a graph illustrating an output signal (detection intensity) of the light receiver when a frequency band of an output signal of a bias adjuster is in a range indicated by A in FIG. 2. FIG. 4 is a graph illustrating an output signal (detection intensity) of the light receiver when a frequency band of an output signal of a signal generator is in a range indicated by B in FIG. 2.

A range (a sweep range of the central frequency of the light LL) in which the central frequency of the light LL is changed to the frequency f1 is a range A illustrated in FIG. 2. When the central frequency of the range matches a bottom (frequency f0) of an absorption spectrum of the alkali metal atoms in the atomic cell 11, the output signal of the phase detector 221 has a waveform of a frequency (period T1) which is a double of the frequency f1, as illustrated in FIG. 3. However, when the central frequency in the sweep range of the central frequency of the light LL deviates from the bottom of the absorption spectrum of the alkali metal atoms in the atomic cell 11, a frequency component of the frequency f1 appears in the output signal of the phase detector 221. The frequency component of the frequency f1 increases as the deviation amount increases. Depending on a direction of the deviation, the phase of the output signal of the phase detector 221 differs at 180°. The output signal of the phase detector 221 is integrated by the lowpass filter 222 to become an error signal (hereinafter referred to as a "first error signal") of the voltage value in accordance with the above-described deviation amount. By using the first error signal, it is possible to perform control such that the central frequency in the sweep range of the central frequency of the light LL is stabilized in the state in which the central frequency matches the bottom of the absorption spectrum of the alkali metal atoms of the atomic cell 11.

A range (a sweep range of a frequency difference between the two pieces of sideband light of the light LL) in which the frequency difference (the frequency of the modulation current) between the two pieces of sideband light of the light LL is changed at the frequency f2 is a range B illustrated in FIG. 2. When the central frequency of the range matches a peak (frequency f0) of an EIT spectrum of the alkali metal atoms in the atomic cell 11, the output signal of the phase detector 241 has a waveform of a frequency (period T2) which is a double of the frequency f2, as illustrated in FIG. 4. However, when the central frequency in the sweep range of the frequency difference between the two pieces of sideband light of the light LL deviates from the peak of the EIT spectrum of the alkali metal atoms in the atomic cell 11, a frequency component of the frequency f2 appears in the output signal of the phase detector 241. The frequency component of the frequency f2 increases as the deviation amount increases. Depending on a direction of the deviation, the phase of the output signal of the phase detector 241 differs at 180°. The output signal of the phase detector 241 is integrated by the lowpass filter 242 to become an error signal (hereinafter referred to as a "second error signal") of the voltage value in accordance with the above-described deviation amount. By using the second error signal, it is possible to perform control such that the central frequency in the sweep range of the frequency difference between the two pieces of sideband light of the light LL is stabilized in the state in which the central frequency matches the peak of the EIT spectrum of the alkali metal atoms of the atomic cell 11.

Figure 5:
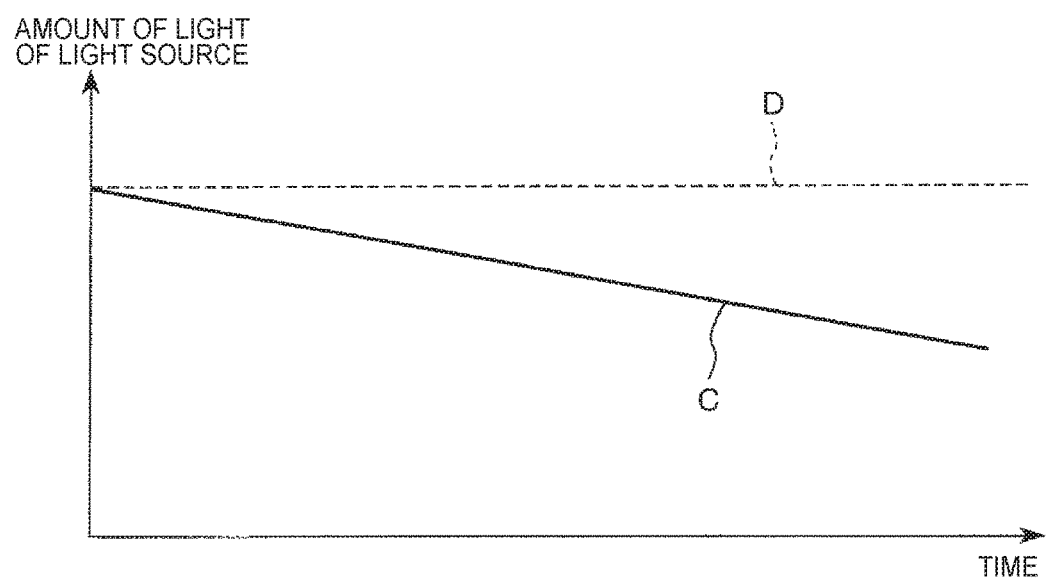
FIG. 5 is a graph illustrating a chronological change in an amount of light of a light-emitting element (an amount of light of a light source) used in the light source.

FIG. 5 is a graph illustrating a chronological change in an amount of light of a light-emitting element used in the light source 12 (an amount of light of a light source).

A light-emitting element used in the light source 12 deteriorates as a use time of the light-emitting element increases. Therefore, when a bias current supplied to the light-emitting element is constant, the amount of light of the light-emitting element is reduced chronologically, as indicated by a solid line C in FIG. 5, which leads to a reduction in a signal level detected by the light detector 13. The alkali metal in the atomic cell 11 is absorbed into a wall surface of the atomic cell 11 as a use time of the alkali meal increases. Therefore, even when the amount of light of the light-emitting element is constant, the atom density of the alkali metal in the atomic cell 11 is reduced chronologically, which leads to a reduction in the signal level detected by the light detector 13.

When the bias current supplied to the light source 12 is constant, an intensity I1 of a signal illustrated in FIG. 3 described above is reduced with the reduction in the amount of the light of the light source 12 and the reduction in the atom density of the alkali metal in the atomic cell 11, as described above. Thus, long-term frequency stability of the atomic oscillator 1 may deteriorate.

Accordingly, in the atomic oscillator 1, as described above, the detector 26 detects the reduction in the output to decrease the reduction in the output of the light detector 13 due to the chronological deterioration in the atomic cell 11 and the light source 12, and the temperature controller 27 controls the driving of the peltier element 14 based on the detection result of the detector 26 so that a portion equivalent to the reduction in the output is compensated. More specifically, the temperature controller 27 controls the driving of the peltier element 14 based on a signal from the filter 263 of the detector 26 described above (that is, a signal in accordance with the amplification factor of the amplifier 261) such that the temperature of the light source 12 is lowered as the output of the light detector 13 is reduced due to the chronological deterioration in the atomic cell 11 and the light source 12.

Here, the light-emitting element used in the light source 12 has characteristics in which the intensity (amount) of the light to be emitted is raised and the central frequency of the light to be emitted is lowered (the wavelength is longer) as the bias current increases and characteristics in which the central frequency of the light to be emitted is raised (the wavelength is shorter) as the temperature is lowered.

Therefore, when the temperature of the light source 12 is lowered, the central frequency of the light LL to be emitted from the light source 12 is raised. Then, the bias current is increased so that the central frequency of the light LL is not raised through the control of the above-described bias current adjuster 22. As a result, the amount of light of the light source 12 is controlled such that the amount of light is constant, as indicated by a dotted line D in FIG. 5, and thus it is possible to decrease the chronological reduction in the intensity I1 of the signal illustrated in FIG. 3. In this way, it is possible to decrease the chronological reduction in the intensity I1 of the signal illustrated in FIG. 3 while stabilizing the central frequency of the light LL.

In the atomic oscillator 1, as described above, the automatic gain control circuit 25 performs control such that the amplitude of the output signal (the microwave signal) of the signal generator 24 is constant. Thus, it is also possible to decrease the chronological reduction in an intensity I2 (a signal component for generating the microwave signal) of the signal illustrated in FIG. 4 described above or decrease the change in the intensity I2 due to disturbance (a temperature change or the like).

As described above, the atomic oscillator 1 that is a kind of "quantum interference device" includes the atomic cell 11 in which the alkali metal is sealed, the light source 12 emitting the light LL for exciting the alkali metal in the atomic cell 11, the peltier element 14 that is the "light source temperature adjuster" adjusting the temperature of the light source 12, and the light detector 13 that is the "light receiver" receiving the light LL transmitted through the atomic cell 11 and outputting a signal in accordance with light reception intensity. In particular, the atomic oscillator 1 includes the detector 26 that outputs a signal in accordance with a chronological change in the amount of light LL transmitted through the atomic cell 11 based on an output signal of the light detector 13 and the temperature controller 27 which is the "light source temperature controller" controlling driving of the peltier element 14 based on an output signal of the detector 26.

In the atomic oscillator 1, the driving of the peltier element 14 is controlled based on the signal in accordance with the chronological change in the amount of light LL transmitted through the atomic cell 11. Therefore, even when at least one of the density of the alkali metal in the atomic cell 11 and the amount of light of the light source 12 chronologically is reduced, it is possible to decrease a chronological reduction in the output signal of the light detector 13. Therefore, frequency characteristics of high precision can be exerted using the output signal of the light detector 13 for a long time. Accordingly, it is possible to improve long-term frequency stability of the atomic oscillator 1.

The atomic oscillator 1 which is a kind (one example) of quantum interference device can be said to include the quantum interference device. The atomic oscillator 1 can have the excellent advantages of the quantum interference device and can have excellent oscillation characteristics.

Here, as described above, the detector 26 includes the amplifier 261, the level detector 262, and the filter 263, has the same configuration as the automatic gain control circuit, and outputs a signal from the filter 263 to the temperature controller 27. That is, the detector 26 can be said to have the automatic gain control circuit to which an output signal of the light detector 13 (the light receiver) is input and output a signal in accordance an amplification factor of the automatic gain control circuit. Thus, it is possible to realize the above-described function of the detector 26 with a relative simple configuration.

The atomic oscillator 1 (the quantum interference device) includes the signal generator 24 that generates a microwave signal in accordance with a transition frequency between two ground levels of the alkali metal atoms in the atomic cell 11 based on the output signal of the light detector 13 (the light receiver) and the driving circuit 23 that drives the light source 12 by inputting a driving current in which a modulation current based on the microwave signal is superimposed on a bias current to the light source 12. Thus, the electromagnetically induced transparency phenomenon can be caused by interaction of the light LL from the light source 12 and the alkali metal atoms. Then, it is possible to realize the quantum interference device (the atomic oscillator 1) of a CPT scheme.

The atomic oscillator 1 (the quantum interference device) includes the bias current adjuster 22 that adjusts a current value of the bias current to be supplied to the light source 12 based on the output signal of the light detector 13 (the light receiver). Thus, control can be performed such that the central wavelength of the light LL from the light source 12 becomes an absorption wavelength of the alkali metal. With a change (reduction) in the temperature of the light source 12, it is possible to adjust (increases) the bias current. Therefore, with control of driving of the peltier element 14 by the temperature controller 27, it is possible to control the amount of light of the light source 12 such that the amount of the light is maintained to be constant.

Preferably, the signal generator 24 generates the microwave signal based on a result obtained by detecting the output signal of the light detector 13 (the light receiver) at each first period, and the detector 26 outputs a signal in accordance with the chronological change in the light LL transmitted through the atomic cell 11 at a second period different from the first period. Thus, it is possible to generate the signal with high precision in regard to the signal generator 24 and the detector 26.

Second Embodiment

Nest, a second embodiment will be described.

Figure 6:
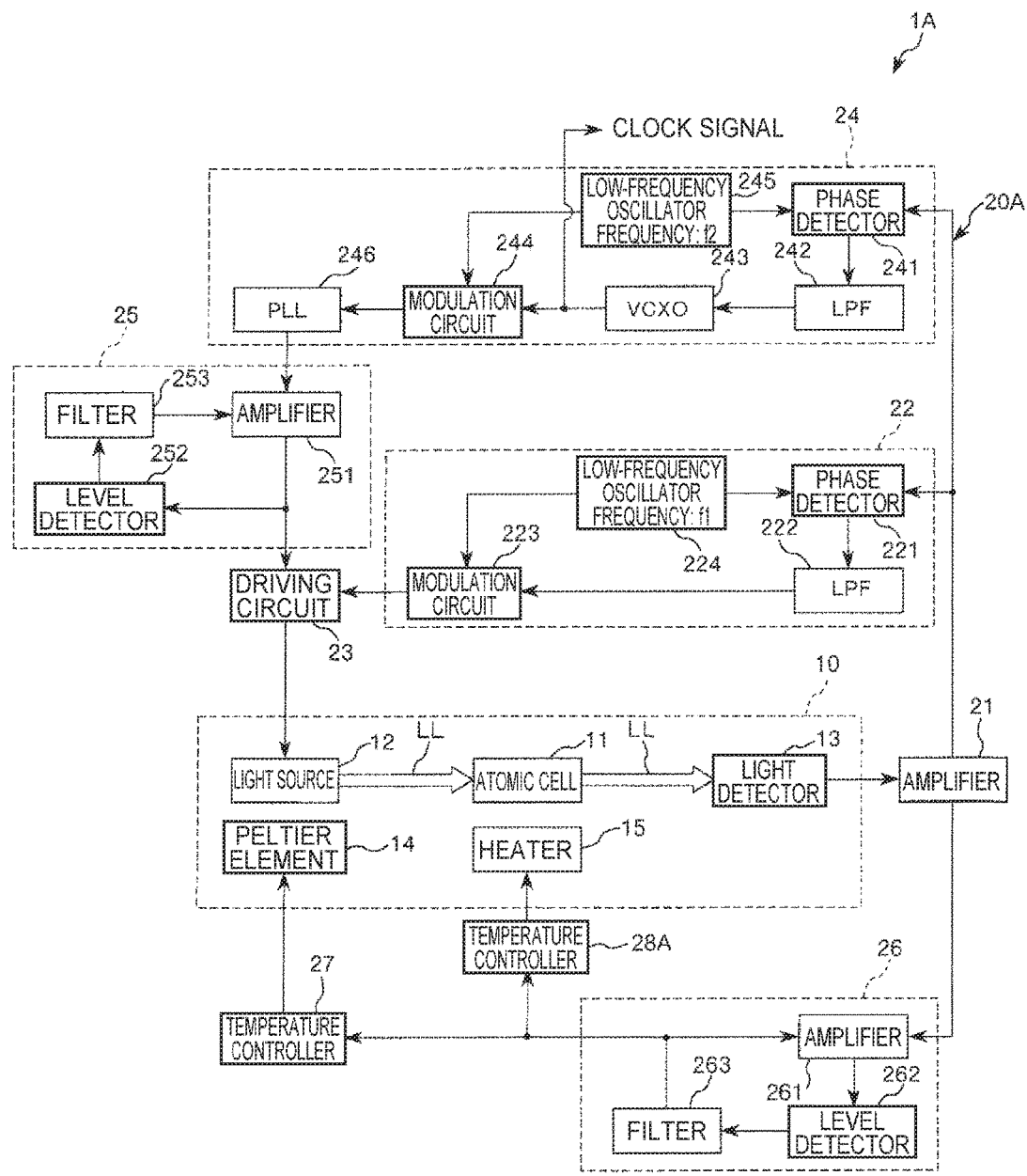
FIG. 6 is a schematic diagram illustrating an overall configuration of an atomic oscillator (which is a kind of a quantum interference device) according to a second embodiment.

FIG. 6 is a schematic diagram illustrating an overall configuration of an atomic oscillator (which is a kind of a quantum interference device) according to the second embodiment.

The embodiment is the same as the above-described first embodiment except that a driving control method for a heater heating an atomic cell is different.

In the following description, differences between the second embodiment and the first embodiment will be mainly described and the description of the same matters will be omitted. In FIG. 6, the same reference numerals are given to the same configurations as those of the above-described embodiment.

As illustrated in FIG. 6, an atomic oscillator 1A illustrated in FIG. 6 is the same as the atomic oscillator 1 according to the above-described first embodiment except that a circuit unit 20A is included instead of the circuit unit 20 according to the above-described first embodiment. The circuit unit 20A is the same as the circuit unit 20 according to the above-described first embodiment except that a temperature controller 28A is included instead of the temperature controller 28 according to the above-described first embodiment.

The temperature controller 28A controls driving of the heater 15 based on an output signal of the detector 26. More specifically, the temperature controller 28A controls the driving of the heater 15 such that the temperature of the atomic cell 11 is raised with a reduction in an output signal of the light detector 13. Thus, it is possible to decrease the reduction in the density of the gaseous alkali metal in the atomic cell 11. Here, for example, a target temperature of the driving control of the heater 15 in the temperature controller 28A is raised with a reduction in the output signal of the light detector 13. At this time, the target temperature is a temperature in a temperature range near 60°. However, the temperature controller 28A may set an upper limit of the target temperature in advance so that the target temperature does not exceed the upper limit.

In this way, the atomic oscillator 1A which is a kind of "quantum interference device" includes the heater 15 that is a "cell temperature adjuster" adjusting the temperature of the atomic cell 11 and the temperature controller 28A that is a "cell temperature controller" controlling driving of the heater 15 based on an output signal of the detector 26. Thus, even when the density of the alkali metal in the atomic cell 11 chronologically is reduced, it is possible to accurately decrease a chronological reduction in the output signal of the light detector 13 by decreasing the reduction in the density of the alkali metal.

According to the above-described second embodiment, it is possible to improve the long-term frequency stability.

2. Electronic Apparatus

Hereinafter, an electronic apparatus will be described.

Figure 7:
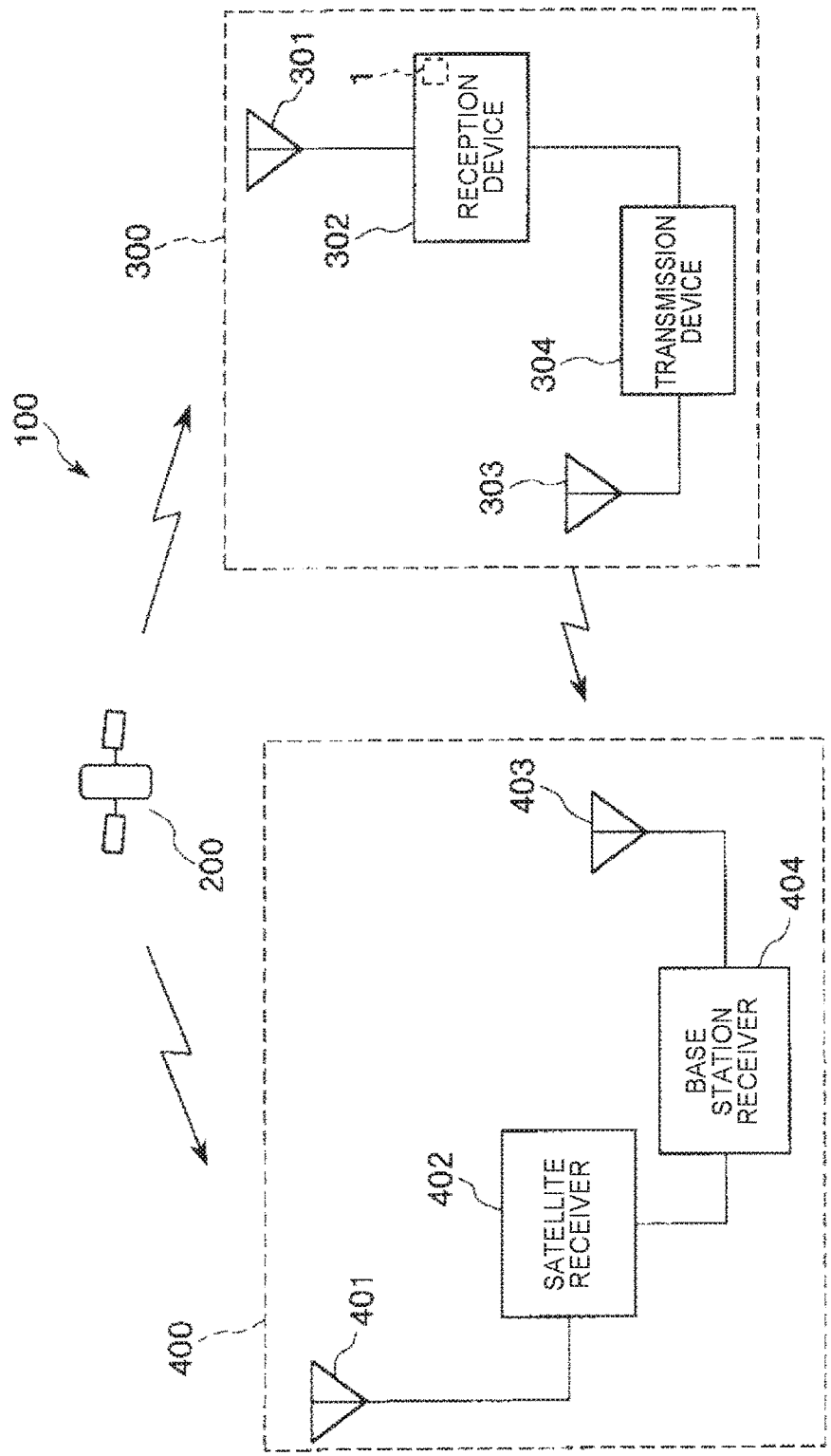
FIG. 7 is a diagram illustrating an embodiment of an electronic apparatus.

FIG. 7 is a diagram illustrating an embodiment of an electronic apparatus.

A positioning system 100 (an electronic apparatus) illustrated in FIG. 7 is configured to includes a GPS satellite 200, abase station apparatus 300, and a GPS reception apparatus 400.

The GPS satellite 200 transmits positioning information (a GSP signal).

The base station apparatus 300 includes a reception apparatus 302 that receives the positioning information from the GPS satellite 200 with high precision via an antenna 301 installed at, for example, an electronic reference point (a GPS continuity observation station) and a transmission apparatus 304 that transmits the positioning information received by the reception apparatus 302 via an antenna 303.

Here, the reception apparatus 302 is an electronic apparatus that includes the above-described atomic oscillator 1 as a reference frequency oscillation source. The reception apparatus 302 has excellent reliability. The positioning information received by the reception apparatus 302 is transmitted to the transmission apparatus 304 in real time.

The GPS reception apparatus 400 includes a satellite receiver 402 that receives the positioning information from the GPS satellite 200 via an antenna 401 and a base station receiver 404 that receives the positioning information from the base station apparatus 300 via the antenna 403.

The reception apparatus 302 which is an "electronic apparatus" included in the above-described positioning system 100 includes the atomic oscillator 1 which is a kind of the "quantum interference device". Therefore, the reception apparatus 302 can have the excellent advantages of the atomic oscillator 1 and can have excellent characteristics. The reception apparatus 302 may include an atomic oscillator 1A instead of the atomic oscillator 1 or in addition to the atomic oscillator 1.

The electronic apparatus including the atomic oscillator is not limited to the above-described electronic apparatus. The invention can be applied to, for example, a smartphone, a tablet terminal, a timepiece, a mobile phone, a digital still camera, an ink jet ejection apparatus (for example, an ink jet printer), a personal computer (a mobile personal computer or a laptop personal computer), a television, a video camera, a video tape recorder, a car navigation apparatus, a pager, an electronic organizer (also including a communication function unit), an electronic dictionary, a calculator, an electronic game apparatus, a word processor, a workstation, a television telephone, a security television monitor, electronic binoculars, a POS terminal, a medical apparatus (for example, an electronic thermometer, a blood-pressure meter, a blood-sugar meter, an electrocardiographic apparatus, an ultrasonic diagnostic apparatus, or an electronic endoscope), a fish finder, various measurement apparatuses, meters (for example, meters for cars, airplanes, and ships), a flight simulator, a digital terrestrial broadcast, and a mobile phone base station.

3. Vehicle

Figure 8:
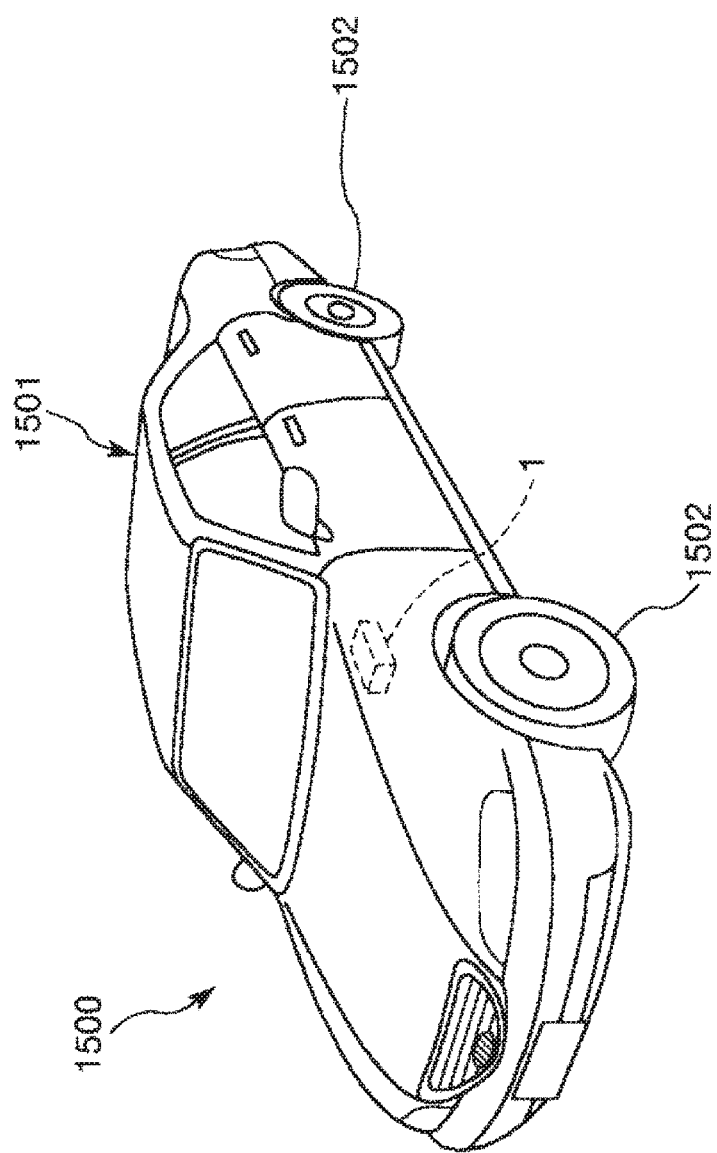
FIG. 8 is a diagram illustrating an embodiment of a vehicle.

FIG. 8 is a diagram illustrating an embodiment of a vehicle.

In FIG. 8, a vehicle 1500 includes a body 1501 and four wheels 1502 and is configured such that the wheels 1502 are rotated by a power source (engine) (not illustrated) installed in the body 1501. The vehicle 1500 contains the atomic oscillator 1.

The above-described vehicle 1500 includes an atomic oscillator 1 which is a kind of a "quantum interference device". Therefore, the vehicle 1500 can have the excellent advantages of the atomic oscillator 1 and can have excellent characteristics. The vehicle 1500 may include an atomic oscillator 1A instead of the atomic oscillator 1 or in addition to the atomic oscillator 1.

The quantum interference device, the atomic oscillator, the electronic apparatus, and the vehicle have been described according to the illustrated embodiments, but the invention is not limited thereto.

In the quantum interference device, the atomic oscillator, the electronic apparatus, and the vehicle, the configuration of each unit can be substituted with any configuration that has the same function and any configuration can also be added.

What is claimed is:

1. A quantum interference device comprising:
an atomic cell in which alkali metal is sealed;
a light source that emits light that excites the alkali metal;
a light source temperature adjuster that adjusts a temperature of the light source;
a light receiver that receives light transmitted through the atomic cell and outputs an output signal in accordance with a light reception intensity;
a detector that outputs an output signal in accordance with a chronological change in an amount of the light transmitted through the atomic cell based on the output signal of the light receiver;
a light source temperature controller that controls driving of the light source temperature adjuster based on the output signal of the detector;
a cell temperature adjuster that adjusts a temperature of the atomic cell; and
a cell temperature controller that controls driving of the cell temperature adjuster based on the output signal of the detector.

2. The quantum interference device according to claim 1, wherein the detector includes an automatic gain control circuit to which the output signal of the light receiver is input and outputs an output signal in accordance with an amplification factor of the automatic gain control circuit.

3. The quantum interference device according to claim 1, further comprising:
a signal generator that generates a microwave signal in accordance with a transition frequency between two ground levels of atoms of the alkali metal based on an output signal of the light receiver; and
a driving circuit that drives the light source by inputting a driving current in which a modulation current based on the microwave signal is superimposed on a bias current to the light source.

4. The quantum interference device according to claim 3, further comprising:
an automatic gain control circuit that amplifies and outputs the microwave signal so that an amplitude of the microwave signal is constant.

5. The quantum interference device according to claim 3, further comprising:
a bias current adjuster that adjusts a value of the bias current based on the output signal of the light receiver.

6. The quantum interference device according to claim 3, wherein the signal generator generates the microwave signal based on a result obtained by detecting the output signal of the light receiver at each first period, and
wherein the detector outputs a signal in accordance with the chronological change at a second period different from the first period.

7. An atomic oscillator comprising:
a crystal oscillator generating a clock signal; and
the quantum interference device according to claim 1 configured to output a modulation signal to the crystal oscillator to adjust the clock signal.

8. An electronic apparatus comprising:
a crystal oscillator generating a clock signal;
the quantum interference device according to claim 1 configured to output a modulation signal to the crystal oscillator to adjust the clock signal; and
a signal receiver configured to generate a reference frequency based on the adjusted clock signal.

9. A quantum interference device comprising:
an atomic cell in which alkali metal is sealed;
a light source that emits light that excites the alkali metal;
a light source temperature adjuster that adjusts a temperature of the light source;
a light receiver that receives light transmitted through the atomic cell and outputs an output signal in accordance with a light reception intensity;
a detector that outputs an output signal in accordance with a chronological change in an amount of the light transmitted through the atomic cell based on the output signal of the light receiver; and
a light source temperature controller that controls driving of the light source temperature adjuster based on the output signal of the detector,
wherein the detector includes an automatic gain control circuit to which the output signal of the light receiver is input and outputs an output signal in accordance with an amplification factor of the automatic gain control circuit.

10. The quantum interference device according to claim 9, further comprising:
a signal generator that generates a microwave signal in accordance with a transition frequency between two ground levels of atoms of the alkali metal based on an output signal of the light receiver; and
a driving circuit that drives the light source by inputting a driving current in which a modulation current based on the microwave signal is superimposed on a bias current to the light source.

11. The quantum interference device according to claim 10,
wherein the automatic gain control circuit amplifies and outputs the microwave signal so that an amplitude of the microwave signal is constant.

12. The quantum interference device according to claim 10, further comprising:
a bias current adjuster that adjusts a value of the bias current based on the output signal of the light receiver.

13. The quantum interference device according to claim 10,
wherein the signal generator generates the microwave signal based on a result obtained by detecting the output signal of the light receiver at each first period, and
wherein the detector outputs a signal in accordance with the chronological change at a second period different from the first period.

14. An atomic oscillator comprising:
a crystal oscillator generating a clock signal; and
the quantum interference device according to claim 9 configured to output a modulation signal to the crystal oscillator to adjust the clock signal.

15. An electronic apparatus comprising:
a crystal oscillator generating a clock signal;
the quantum interference device according to claim 9 configured to output a modulation signal to the crystal oscillator to adjust the clock signal; and
a signal receiver configured to generate a reference frequency based on the adjusted clock signal.

* * * * *